(12) United States Patent
Kuo

(10) Patent No.: US 8,227,889 B2
(45) Date of Patent: Jul. 24, 2012

(54) SEMICONDUCTOR DEVICE

(75) Inventor: Chien-Li Kuo, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 560 days.

(21) Appl. No.: 12/330,455

(22) Filed: Dec. 8, 2008

(65) Prior Publication Data

US 2010/0140749 A1    Jun. 10, 2010

(51) Int. Cl.
*H01L 21/762* (2006.01)

(52) U.S. Cl. ............... 257/508; 257/E23.145; 257/621; 257/774; 438/348; 438/361; 438/629

(58) Field of Classification Search ........... 257/E23.174, 257/503, 508, 621, 734, E23.145, 774–776; 438/629, 637, 639, 640, 348, 361, 667, 668, 438/672, 675, 700, 701, 713, 978
See application file for complete search history.

(56) References Cited

U.S. PATENT DOCUMENTS

| 7,525,186 | B2 * | 4/2009 | Kim et al. | 257/686 |
| 7,561,410 | B1 * | 7/2009 | Lee et al. | 361/525 |
| 7,589,390 | B2 * | 9/2009 | Yao | 257/503 |
| 7,808,072 | B2 * | 10/2010 | Choi et al. | 257/508 |
| 7,902,643 | B2 * | 3/2011 | Tuttle | 257/659 |
| 2008/0073747 | A1 | 3/2008 | Chao | |

* cited by examiner

*Primary Examiner* — Chris Chu
(74) *Attorney, Agent, or Firm* — Winston Hsu; Scott Margo

(57) ABSTRACT

A semiconductor device with a TSV and a shelter is provided. The semiconductor device includes a substrate, a circuit area, at least a TSV and a shelter. The circuit area and the TSV are disposed on the substrate, and the TSV penetrates through the substrate. The shelter is disposed on the substrate and at least one part thereof is between the circuit area and the TSV in order to shelter EMI between the TSV and the circuit area. The novel structure prevents the circuits in the circuit area being affected by noise caused by TSV when TSV acts as a power pin.

20 Claims, 4 Drawing Sheets

SEMICONDUCTOR DEVICE

BACKGROUND OF THE INVENTION

1. Field of the Invention

The present invention relates to a semiconductor device, and more particularly, to a semiconductor device with a TSV and a shelter.

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and packaged to form a chip; finally, the chip is attached onto a board, for example, a printed circuit board (PCB), and the chip is electrically coupled to the pins on the PCB. Thus, each of the programs on the chip can be performed.

In order to evaluate the functions and efficiency of the chip and increase the capacitance density to accommodate more IC components in a limited space, many semiconductor package technologies are built up by stacking each die and/or chip, for example, Flip-Chip technology, Multi-chip Package (MCP) technology, Package on Package (PoP) technology and Package in Package (PiP) technology. Besides these technologies, a "Through Silicon Via (TSV)" technique has been well developed in recent years. TSV can improve the interconnections between chips in the package so as to increase the package efficiency.

The first step to fabricate a TSV is to form a via on a wafer by an etching or a laser process, then fill the via with copper, polycrystalline silicon, tungsten, or other conductive material; next, the chip is thinned and the chips are packaged or bonded to form a 3D package structure. By using the TSV technique, there can be a shortest interconnection route between the chips. So, with comparison to other technologies, TSV has the advantages of fast-speed, less noise and better efficiency, and therefore looks set to become one of the most popular technologies in the future.

FIG. 1 illustrates two conventional stacking dies with TSV. As shown in FIG. 1, die 1 comprises a substrate 11, with a plurality of metal interconnect layers 13 disposed on the substrate 11. The metal interconnect layers 13 horizontally and vertically connect some active or passive components (not shown) within die 1 and further couple to a contact pad 15. A plurality of TSVs 14 are disposed in the substrate 11, and each TSV 14 penetrates through the substrate 11 so as to connect upward to the metal interconnect layers 13 and downward to a solder ball 16.

Die 2 comprises: a substrate 21, a plurality of metal interconnect layers 23, a plurality of TSVs 24, a plurality of contact pads 25 and a plurality of solder balls 26, wherein the relative position of each component is the same as in die 1. When stacking die 1 and die 2, the solder balls 26 of die 2 are electrically coupled to the contact pads 15 of die 1, making die 1 and die 2 electrically interconnect with each other to form a stable stacking structure. It is understood that die 1 could connect downward to a package substrate or a PCB (not shown) with the solder ball 16 for an outer power supply or a signal input/output. Similarly, die 2 could connect upward to another die (not shown) with the contact pad 25 to perform a multi-layer package.

FIG. 2 illustrates a sectional diagram of a conventional die with a TSV. As shown in FIG. 2, die 1 comprises: a substrate 11, a plurality of metal interconnect layers 13, a plurality of TSVs 14, a power distribution layer 18 and a contact pad 15. The metal interconnect layers 13 are disposed on the substrate 11 and horizontally and vertically connect some active or passive components (not shown) within die 1. Each TSV 14 penetrates through the substrate 11 and connects upward to the metal interconnect layers 13 and is open downward to a bottom surface of the substrate 11. An outer signal is transmitted from the TSV 14 to the metal interconnect layer 13.

Referring to the area A in FIG. 2, die 1 further comprise a circuit area 17. The circuit area 17 connects to the metal interconnect layer 13 and includes many semiconductor active components such as transistors or memories, or many passive semiconductor components such as inductors or resistors that can carry out electronic programs. The area A shows a TSV 14 acting as a "signal pin", which means when an outer signal enters the TSV 14, it will pass through the metal interconnect layer 13 and reach the circuit area 17, then, after the circuit area 17 finishes the electronic program, the signal transmits to another metal interconnect layer 13, hence completing the program.

The area B shows a TSV 14 acting as a "power pin" which means the TSV 14 is coupled to a power supply. As a result, the TSV 14 as a power pin transmits more current than when it acts as a signal pin. For better transmission efficiency, a thicker and less-resistant power distribution layer 18 is disposed on the upper portion of the die 1. With the metal interconnect layer 13 that couples the TSV 14 and the power distribution layer 18, the power supply can conduct from the TSV 14 to the power distribution layer 18 for intra die power distribution.

However, when the TSV 14 acts as a power pin, the current conducted through the metal interconnect layer 13 is massive, thereby causing serious electromagnetic interference (EMI) to adjacent circuits, for example, the metal interconnect circuit 13 or the circuit area 17 in area A. This is an urgent problem to be resolved.

Therefore, it is necessary to provide a semiconductor device to prevent EMI in adjacent circuits caused by massive currents when TSV acts as a power pin

SUMMARY OF THE INVENTION

The present invention discloses a semiconductor device with a TSV and a shelter. The semiconductor device comprises a substrate, a circuit area, at least a TSV and a shelter. The circuit area and the TSV are disposed on the substrate, and the TSV penetrates through the substrate. The shelter is disposed on the substrate and at least one part thereof is between the circuit area and the TSV in order to shelter the EMI between the TSV and the circuit area.

According to the novel shelter component disposed between the TSV and the circuit area, noise in adjacent circuits due to massive currents when TSV acts as a power pin can be efficiently prevented.

These and other objectives of the present invention will no doubt become obvious to those of ordinary skill in the art after reading the following detailed description of the preferred embodiment that is illustrated in the various figures and drawings.

DETAILED DESCRIPTION

Referring to the words "up" or "down" that describe the relationship between components in the text, it is well known in the art and should be clearly understood that these words refer to relative positions that can be inverted to obtain a same structure, and these structures should therefore not be precluded from the scope of the claims in the present invention.

Figure 1:
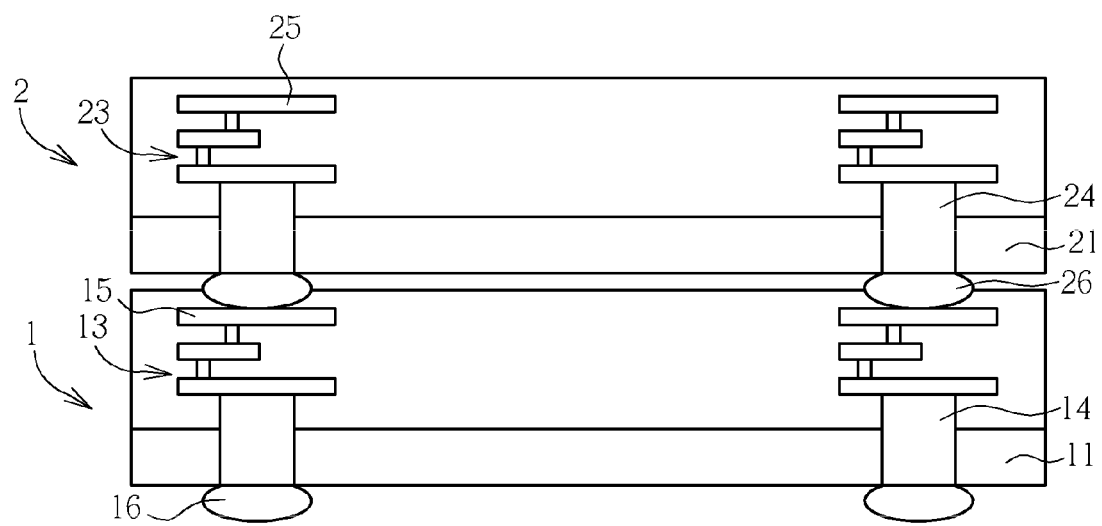
FIG. 1 illustrates two conventional stacking dies with TSV.
Figure 2:
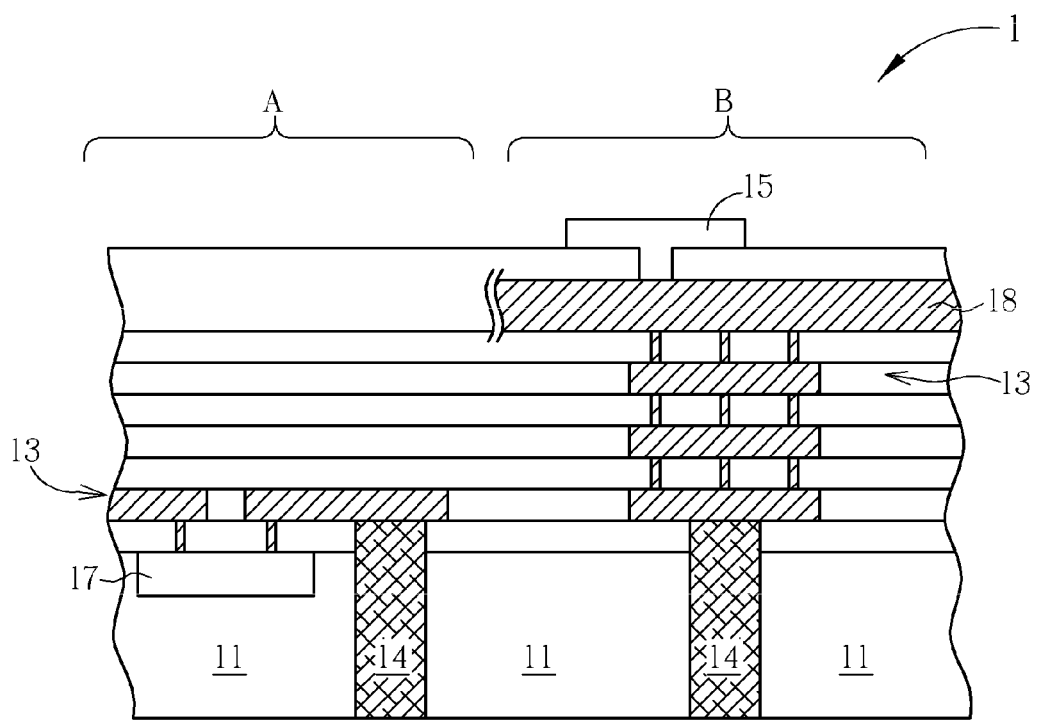
FIG. 2 illustrates a sectional diagram of a conventional die with a TSV.
Figure 3:
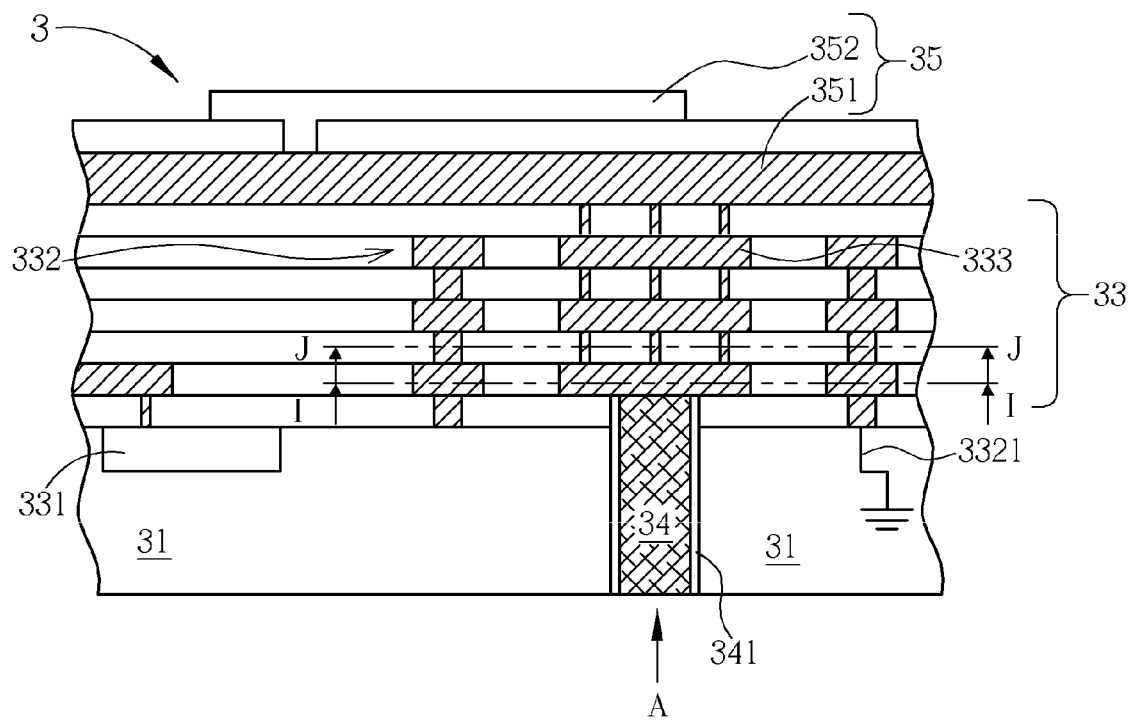
FIG. 3 illustrates the semiconductor device of the present invention.

FIG. 3 illustrates the semiconductor device in the present invention. As shown in FIG. 3, the semiconductor device 3 in the present invention comprises a substrate 31, at least a TSV 34, a plurality of metal interconnect layers 33 and a circuit area 331. The substrate 31 is composed of single-crystalline silicon, gallium arsenide (GaAs) or other well-known material. The TSV 34 is disposed in the substrate 31 and penetrates through the substrate 31. The TSV 34 is composed of copper, polycrystalline silicon, tungsten, aluminum or other conductive material, and is wrapped by an insulation layer 341 to prevent leakage current when conducting electricity. The metal interconnect layers 33 are disposed on the substrate 31 and comprise a shelter 332 and a connecting circuit 333. The connecting circuit 333 is disposed on the substrate 31 and comprises a plurality of metal circuit layers and a plurality of vias that may electrically connect the TSV 34 and a power input/output pad 35. The power input/output pad 35 is disposed on the substrate 31: in the preferred embodiment of the present invention, it is disposed above the connecting circuit 333. The power input/output pad 35 comprises a thicker power distribution layer 351. The power distribution layer 351 is composed of aluminum, copper or other conductive material and can transmit power all through the chip. Hence, when the power supply (arrow A) enters the TSV 34 and passes through the connecting circuit 333, it can reach the power distribution layer 351 for intra die power distribution. The power input/output pad 35 further comprises a contact pad 352, which is disposed on the power distribution layer 351 and composed of aluminum, copper or other conductive material. As shown in FIG. 1 and FIG. 3, the contact pad 352 could further connect upward to another chip or die (not shown) to transmit power.

The semiconductor device 3 in the present invention further comprises a circuit area 331 that includes many semiconductor active components such as transistors or memories, or many passive semiconductor components such as inductors or resistors that can carry out electronic programs. When the TSV 34 acts as a power pin, the massive current transmitted from the connecting circuit 333 to the power input/output 35 will cause serious electromagnetic interference (EMI) to adjacent circuits, for example, the circuit area 331. Thus, the semiconductor device 3 of the present invention further comprises a shelter 332 to solve this problem. The shelter 332 is disposed in the metal interconnecting layers 33: in the preferred embodiment of the present invention, it is disposed on the periphery of the connecting circuit 333 and the TSV 34. It is understood that the shelter 332 could be disposed on only the periphery of the connecting circuit 333 or only the periphery of the TSV 34. As a result, the EMI produced by the massive current conducting through the TSV 34 and the connecting circuit 333 can be prevented by the shelter 332. The shelter 332 is selected from a group consisting of copper, aluminum, tungsten, titanium, titanium nitride, tantalum, tantalum nitride. However, the material of the shelter 332 depends on the integration of the semiconductor manufacture process and is not limited to the above.

Figure 4:
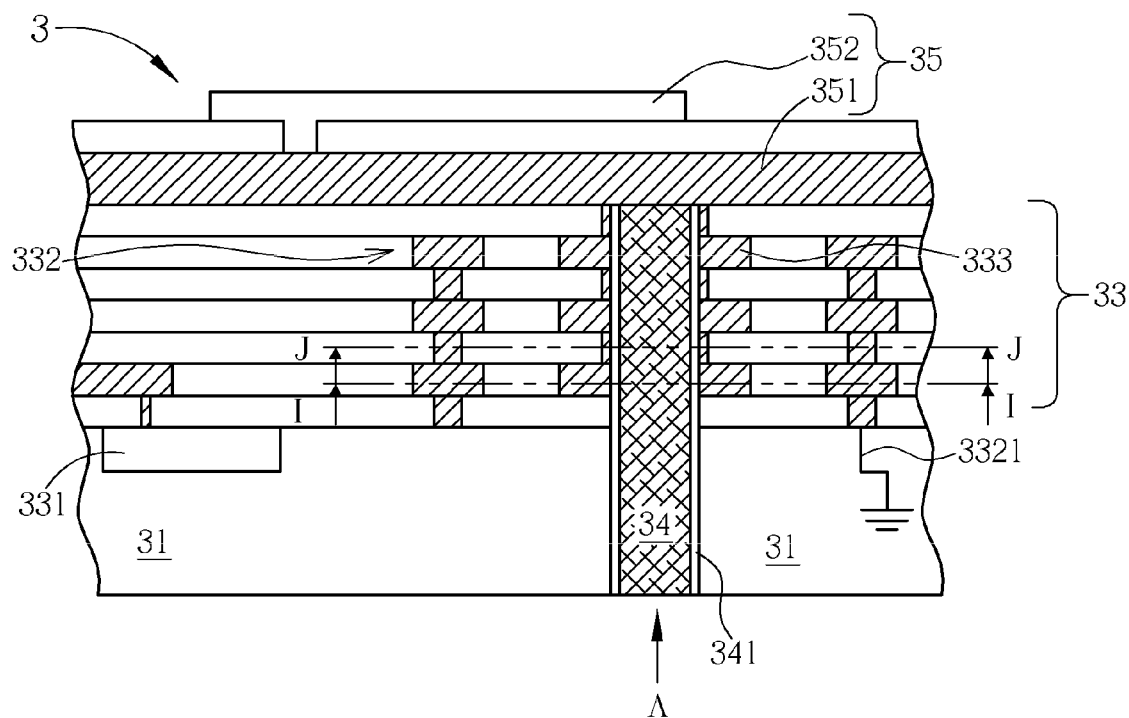
FIG. 4 and FIG. 5 illustrate another embodiment of the semiconductor device of the present invention.

In another embodiment of the present invention, the TSV 34 is directly coupled to the power input/output pad 35 without the connecting circuit 333. As shown in FIG. 4, the power supply (arrow A) can directly enter the TSV 34 and reach the power input/output pad 35 for intra die power distribution. Thus, the shelter 332 is disposed on the periphery of the TSV 34.

Figure 5:
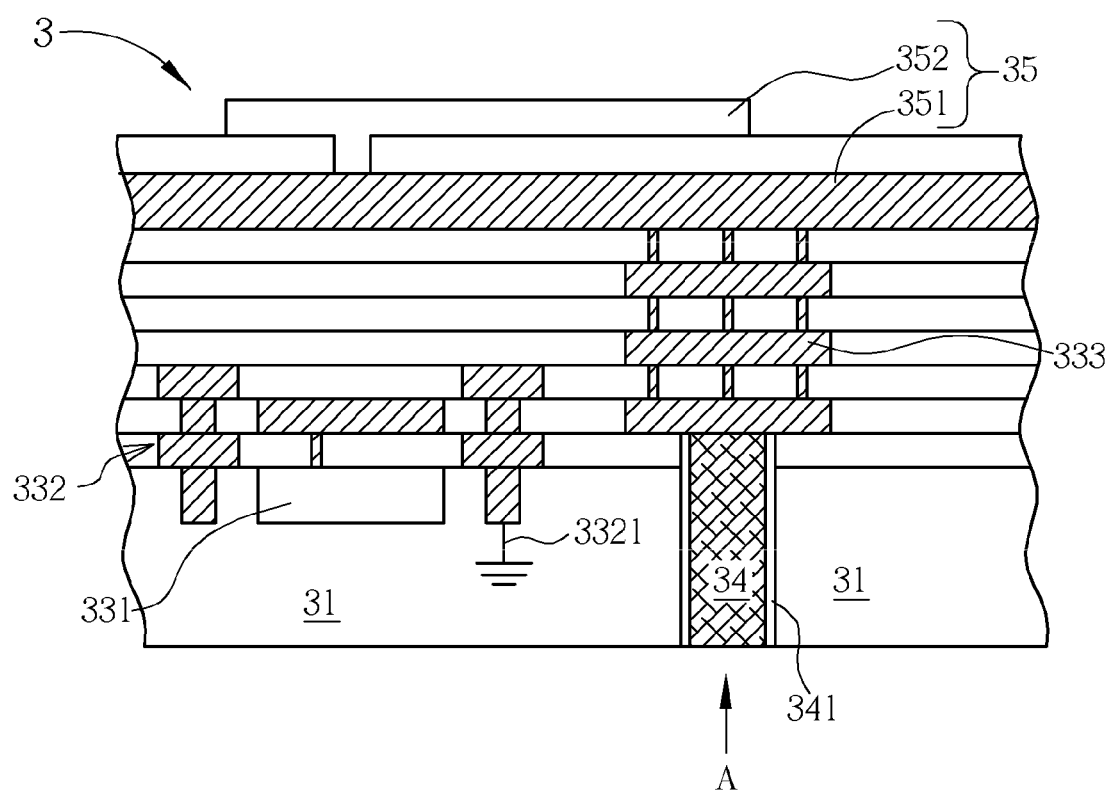

In still another embodiment of the present invention, the shelter 332 can be disposed on the periphery of the circuit area 331, as shown in FIG. 5. This may also prevent the EMI caused by the TSV 34 and the connecting circuit 333.

Figure 6:
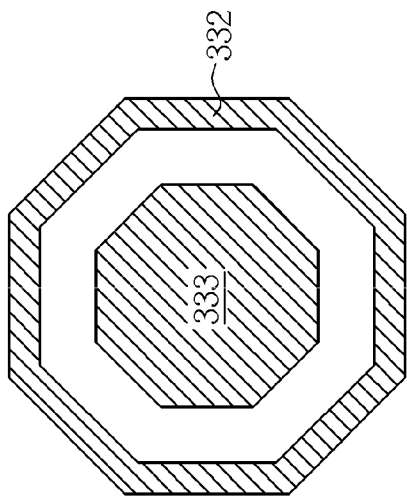
Figure 7:
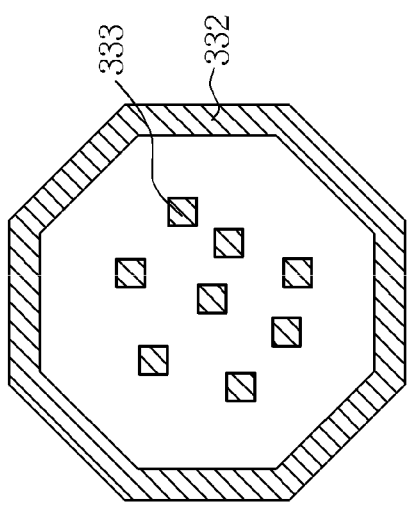

Regarding to the structure and the shape of the shelter 332, please refer to FIG. 6 to 10, wherein FIGS. 6 and 7 illustrate the sectional diagram according to line I in FIG. 3 and FIG. 8 to 10 illustrate the sectional diagram according to line J in FIG. 3. Line I and line J correspond to the metal circuit layers and the vias of connecting circuit 333 respectively.

It is clear to see that the shelter 332 could comprise a continuous metal layer or a dispersed metal layer. As shown in FIG. 6, the shelter 332 comprises at least a continuous metal layer, and as shown in FIG. 7, the shelter 332 comprises at least a dispersed, non-continuous metal layer. On the other hand, regarding to the sectional diagram according to line j that represents the vias part of the connection circuit 333, as shown in FIG. 8, the shelter 332 may also comprise at least a continuous metal layer, and as shown in FIG. 9, the shelter 332 may also comprise at least a dispersed, non-continuous metal layer.

Figure 10:
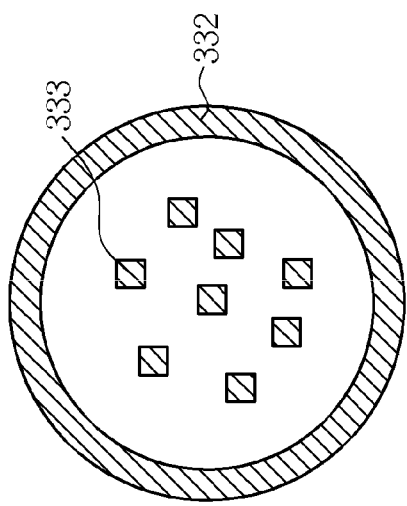
FIG. 6~FIG. 11 illustrate the shelter of the semiconductor device of the present invention.
Figure 8:
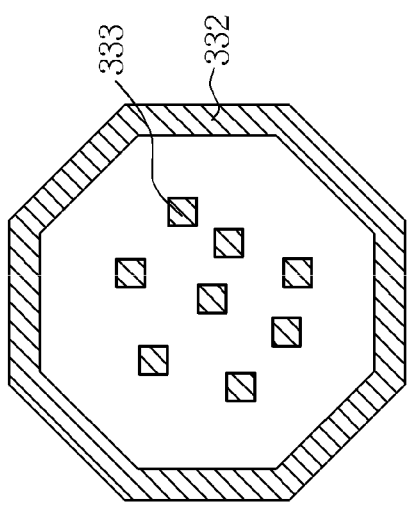
Figure 9:
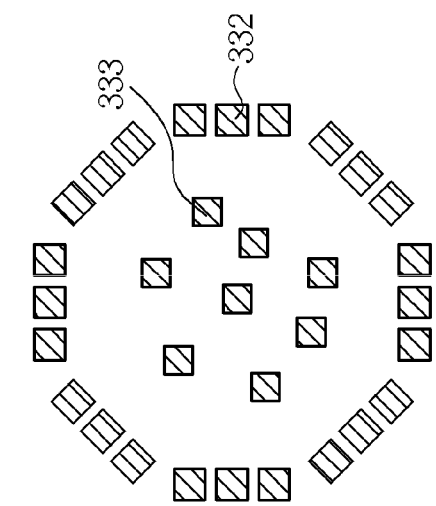

Regarding to the shape of the shelter 332, please refer to FIG. 8 and FIG. 10, which illustrate the shape of the shelter 332. Both FIG. 8 and FIG. 10 show the sectional diagram according to line J in FIG. 3. In general, the shelter 332 of the present invention comprises at least a polygon metal layer. In one embodiment of the present invention, the shelter 332 comprises at least an octagonal metal layer, as shown in FIG. 8; in another embodiment of the present invention, the shelter 332 comprises at least a circular metal layer, as shown in FIG. 10.

Figure 11:
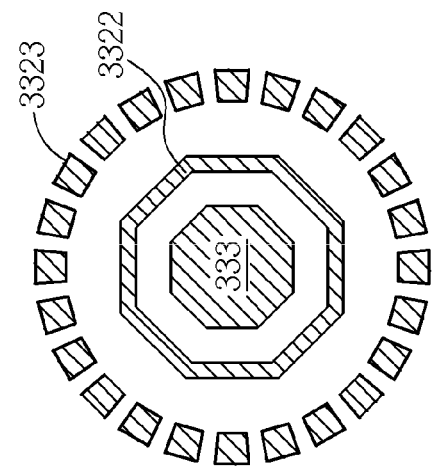

As a result, the configuration of the shelter 332 is not limited by aforesaid embodiment but should include any combinations of the continuous/dispersed and the polygon structure. Besides, the shelter 332 in the present invention is not limited by single layer structure but may comprise a poly layer structure. Please refer to FIG. 11, showing a poly layer shelter 332 structure in the present invention. The shelter 332 structure in the present invention comprises a first shelter 3322 and a second shelter 3323, wherein the first shelter 3322 is a continuous, octagonal metal layer and the second shelter 3323 is a dispersed, circular metal layer. It is understood that the shelter 332 structure may further comprise a third shelter (not shown) or a fourth shelter (not shown) that may also increase the shelter effect. Each of the shelters 332 may also be any combinations of the continuous/dispersed and the polygon structure.

Besides, if the lay-out arrangement of the metal layers and vias is well adjusted, the shelter structure of the present invention can be achieved by using conventional metal interconnection manufacture process such as: aluminum fabrication process, via plug fabrication process or Cu damascene. Each process can be substantially integrated into existing semiconductor manufacture processes, thereby forming the shelter 332 and the connecting circuit 333 simultaneously. Furthermore, the layout of the shelter 332 and the connecting circuit 333 are not limited by above-mentioned concepts of continuous/dispersed, circular/octagonal or single layer/poly layer but rather depend on the manufacturing process. As a result, the shelter 332 is disposed on the periphery of the TSV 34, connecting circuit 333 or the circuit area 331 so as to prevent EMI on the circuit area 331 when massive currents are transmitted.

In order to increase the sheltering effect, the shelter 332 structure in the present invention is further coupled to a ground connection 3321, as shown in FIG. 3. The ground connection 3321 may connect to a stable grounding device, such as a system plate installed with semiconductor package (not shown), or a chip-scale ground connection, in order to control the noise more efficiently. Furthermore, a high-frequency wave filter may be used between the system plate and the shelter 332 to selectively remove the high-frequency noise.

Accordingly, the semiconductor device in the present invention comprises a shelter 332 disposed on the periphery of the TSV 34 and/or the connecting circuit 333 and couples to a ground connection 3321, so as to prevent EMI on adjacent circuits such as the circuit area 331 when the TSV acts as a power pin.

Those skilled in the art will readily observe that numerous modifications and alterations of the device and method may be made while retaining the teachings of the invention.

What is claimed is:

1. A semiconductor device comprising:
    a substrate;
    a circuit area;
    at least a through silicon via (TSV) that penetrates through the substrate;
    a first shelter disposed only on the substrate and at least a part of the first shelter is between the TSV and the circuit area and
    a plurality of metal interconnect layers, wherein the metal interconnect layers comprise:
        a first metal interconnect layer that comprises the first shelter; and
        a second metal interconnect layer that comprises a connecting circuit electrically coupling the TSV.

2. The semiconductor device of claim 1, further comprising a power input/output pad disposed on the substrate, wherein the TSV is electrically coupled to the power input/output pad.

3. The semiconductor device of claim 2, wherein the connecting circuit is electrically coupled to the power input/output pad.

4. The semiconductor device of claim 1, wherein the first shelter is disposed on the periphery of the connecting circuit.

5. The semiconductor device of claim 1, wherein the first shelter comprises at least a polygon metal layer.

6. The semiconductor device of claim 5, wherein the first shelter comprises at least an octagonal metal layer.

7. The semiconductor device of claim 5, wherein the first shelter comprises at least a circular metal layer.

8. The semiconductor device of claim 1, wherein the first shelter comprises at least a continuous metal layer.

9. The semiconductor device of claim 1, wherein the first shelter comprises at least a dispersed metal layer.

10. The semiconductor device of claim 1, further comprising at least a second shelter, wherein each of the second shelters compasses the first shelter.

11. The semiconductor device of claim 10, wherein at least one of the second shelters comprises a polygon metal layer.

12. The semiconductor device of claim 11, wherein at least one of the second shelters comprises an octagonal metal layer.

13. The semiconductor device of claim 11, wherein at least one of the second shelters comprises a circular metal layer.

14. The semiconductor device of claim 10, wherein at least one of the second shelters comprises a continuous metal layer.

15. The semiconductor device of claim 10, wherein at least one of the second shelters comprises a dispersed metal layer.

16. The semiconductor device of claim 10, wherein the second shelter is selected from a group consisting of copper, aluminum, tungsten, titanium, titanium nitride, tantalum, and tantalum nitride.

17. The semiconductor device of claim 10, wherein the second shelter is coupled to a ground connection.

18. The semiconductor device of claim 1, wherein the first shelter is selected from a group consisting of copper, aluminum, tungsten, titanium, titanium nitride, tantalum, and tantalum nitride.

19. The semiconductor device of claim 1, wherein the TSV is electrically coupled to a power supply.

20. The semiconductor device of claim 1, wherein the first shelter is coupled to a ground connection.

* * * * *